(12) United States Patent
Feldman-Peabody et al.

(10) Patent No.: US 8,257,561 B2
(45) Date of Patent: Sep. 4, 2012

(54) METHODS OF FORMING A CONDUCTIVE TRANSPARENT OXIDE FILM LAYER FOR USE IN A CADMIUM TELLURIDE BASED THIN FILM PHOTOVOLTAIC DEVICE

(75) Inventors: Scott Daniel Feldman-Peabody, Golden, CO (US); Jennifer Ann Drayton, Golden, CO (US); Robert Dwayne Gossman, Aurora, CO (US); Mehran Sadeghi, Orpington (GB)

(73) Assignee: Primestar Solar, Inc., Arvada, CO (US)

( * ) Notice: Subject to any disclaimer, the term of this patent is extended or adjusted under 35 U.S.C. 154(b) by 266 days.

(21) Appl. No.: 12/750,056

(22) Filed: Mar. 30, 2010

(65) Prior Publication Data

US 2011/0244251 A1  Oct. 6, 2011

(51) Int. Cl.
C23C 14/34 (2006.01)
(52) U.S. Cl. ......... 204/192.29; 204/192.15; 204/192.12; 204/192.17
(58) Field of Classification Search ............. 204/192.12, 204/192.15, 192.17, 192.29
See application file for complete search history.

(56) References Cited

U.S. PATENT DOCUMENTS

| | | | |
|---|---|---|---|
| 3,811,953 A | 5/1974 | Nozik | |
| 5,261,968 A | 11/1993 | Jordan | |
| 5,304,499 A | 4/1994 | Bonnet et al. | |
| 5,393,675 A | 2/1995 | Compaan | |
| 5,474,939 A | 12/1995 | Pollock et al. | |
| 5,922,142 A | 7/1999 | Wu | |
| 6,137,048 A | 10/2000 | Wu | |
| 6,169,246 B1 | 1/2001 | Wu et al. | |
| 6,221,495 B1 | 4/2001 | Wu et al. | |
| 6,902,813 B2 | 6/2005 | O'Shaughnessy et al. | |
| 6,921,579 B2 | 7/2005 | O'Shaughnessy et al. | |
| 6,974,976 B2 | 12/2005 | Hollars | |
| 7,309,527 B2 | 12/2007 | O'Shaughnessy et al. | |
| 2005/0009228 A1 | 1/2005 | Wu et al. | |
| 2005/0224111 A1 | 10/2005 | Cunningham et al. | |
| 2008/0096376 A1 | 4/2008 | Li et al. | |
| 2008/0105293 A1 | 5/2008 | Lu et al. | |

(Continued)

FOREIGN PATENT DOCUMENTS

WO 00/14812 A1 3/2000

OTHER PUBLICATIONS

Huang S et al: "Interface morphology of CdS thin films grown on cadmium stannate and glass substrates studied by grazing incidence x-ray scattering", Journal of Vacuum Science and Technology: Part A, AVS /AIP, Melville, NY., US,vol. 17, No. 5, Sep. 1, 1999, pp. 2685-2691, XP012004765.

(Continued)

*Primary Examiner* — Keith Hendricks
*Assistant Examiner* — Jason M Berman
(74) *Attorney, Agent, or Firm* — Dority & Manning, P.A.

(57) ABSTRACT

Methods are generally provided for forming a conductive oxide layer on a substrate. In one particular embodiment, the method can include sputtering a transparent conductive oxide layer on a substrate at a sputtering temperature from about 10° C. to about 100° C. A cap layer including cadmium sulfide can be deposited directly on the transparent conductive oxide layer. The transparent conductive oxide layer can be annealed at an anneal temperature from about 450° C. to about 650° C. Methods are also generally provided for manufacturing a cadmium telluride based thin film photovoltaic device. An intermediate substrate is also generally provided for use to manufacture a thin film photovoltaic device.

19 Claims, 4 Drawing Sheets

U.S. PATENT DOCUMENTS

| | | |
|---|---|---|
| 2008/0105302 A1 | 5/2008 | Lu et al. |
| 2008/0210303 A1 | 9/2008 | Lu et al. |
| 2008/0302414 A1 | 12/2008 | Den Boer et al. |
| 2009/0014065 A1 | 1/2009 | Mueller et al. |
| 2009/0020149 A1 | 1/2009 | Woods et al. |
| 2009/0126791 A1 | 5/2009 | Lu et al. |
| 2009/0194165 A1 | 8/2009 | Murphy et al. |
| 2009/0242029 A1 | 10/2009 | Paulson et al. |
| 2009/0272437 A1 | 11/2009 | Roberts et al. |

OTHER PUBLICATIONS

Wu X et al: "Application of $Cd_2SnO_4$ transparent conducting oxides CdS/CdTe thin-film devices", Conference Record of the 26TH IEEE Photovoltaic Specialists Conference 19970929; 19970929-19971003 New York, NY: IEEE, US, Sep. 29, 1997, pp. 347-350, XP010267796.

EP Search Report issued in connection with corresponding EP Patent Application No. 11160306.4 filed on Mar. 29, 2011.

English Abstract JP 2001223376, Published Aug. 17, 2001.

Haacke, G. "Transparent electrode properties of cadmium stannate", *Applied Physics Letters*, vol. 28, No. 10. pp. 622-623, May 15, 1976.

Wu, Xuanzhi. "High-efficiency polycrystalline CdTe thin-film solar cells", *Solar Energy* 77, pp. 803-814, 2004.

Haacke, G. et al., "Sputter deposition and characterization of $Cd_2SnO_4$ Films" *Thin Solid Film* 55, pp. 67-81, 1978.

METHODS OF FORMING A CONDUCTIVE TRANSPARENT OXIDE FILM LAYER FOR USE IN A CADMIUM TELLURIDE BASED THIN FILM PHOTOVOLTAIC DEVICE

FIELD OF THE INVENTION

The subject matter disclosed herein relates generally to forming a conductive transparent oxide film layer. More particularly, the subject matter disclosed herein relates to methods of forming a conductive transparent oxide film layer for use in cadmium telluride thin film photovoltaic devices.

BACKGROUND OF THE INVENTION

Thin film photovoltaic (PV) modules (also referred to as "solar panels") based on cadmium telluride (CdTe) paired with cadmium sulfide (CdS) as the photo-reactive components are gaining wide acceptance and interest in the industry. CdTe is a semiconductor material having characteristics particularly suited for conversion of solar energy to electricity. For example, CdTe has an energy bandgap of about 1.45 eV, which enables it to convert more energy from the solar spectrum as compared to lower bandgap semiconductor materials historically used in solar cell applications (e.g., about 1.1 eV for silicon). Also, CdTe converts radiation energy in lower or diffuse light conditions as compared to the lower bandgap materials and, thus, has a longer effective conversion time over the course of a day or in cloudy conditions as compared to other conventional materials. The junction of the n-type layer and the p-type layer is generally responsible for the generation of electric potential and electric current when the CdTe PV module is exposed to light energy, such as sunlight. Specifically, the cadmium telluride (CdTe) layer and the cadmium sulfide (CdS) form a p-n heterojunction, where the CdTe layer acts as a p-type layer (i.e., a positive, electron accepting layer) and the CdS layer acts as a n-type layer (i.e., a negative, electron donating layer).

A transparent conductive oxide ("TCO") layer is commonly used between the window glass and the junction forming layers. For example, the TCO layer may be sputtered from a cadmium stannate (i.e., $Cd_2SnO_4$) target by either of two processes: hot sputtering or cold sputtering. When hot sputtered, the TCO layer is typically deposited at sputtering temperatures above about 250° C. in a one step sputtering process. When cold sputtered (e.g., at about room temperature), the TCO layer must be annealed following sputtering of the layer in a second step to convert the layer from an amorphous layer to a crystalline layer.

Though the hot sputtering process is more streamlined (i.e., only requiring a single step), the hot sputtered TCO layers can have a much higher resistivity than the cold sputtered TCO layers—even when sputtered from the same material (e.g., cadmium stannate)—making the hot sputtered TCO layer less attractive for the end use. Although not wishing to be bound by any particular theory, it is believed that this difference in resistivities between the hot sputtered layer and the cold sputtered layer likely stems from a difference in the as-deposited stoichiometry. For example, when sputtering from a cadmium stannate target, it is presently believed that cold sputtering produces a layer having the stoichiometry $Cd_2SnO_4$, which is the desired stoichiometry for cadmium stannate. On the other hand, hot sputtering from a cadmium stannate target at certain elevated temperatures is presently believed to produce a layer having the stoichiometry of about $CdSnO_3+SnO_2$, although the exact stoichiometry of the layer is likely some function of temperature. Thus, it is desirable to form the TCO layer via cold sputtering to obtain the desired stoichiometry.

However, other processing issues exist that hinders the viability of cold sputtering to form the TCO layer, especially from a cadmium stannate target. First, the annealing process can sublimate cadmium atoms off of the TCO layer, altering the stoichiometry of the TCO layer, especially along its outer surface. Second, the annealing process can cause cracks and/or delamination of the TCO layer on the substrate, probably forming while increasing the substrate temperature from the sputtering temperature to the anneal temperature, while cooling from the anneal temperature back to room temperature, and/or from the phase change from amorphous to crystalline which also may result in a density/volume change. These two processing issues can lead to the stability problems in the TCO layers of the resulting PV devices, whereas such issues are not present in PV devices formed with TCO layers formed via hot sputtering.

Thus, a need exists for a TCO layer having the conductivity of those cold sputtered layers with the processing and device stability found in those hot sputtered layers.

BRIEF DESCRIPTION OF THE INVENTION

Aspects and advantages of the invention will be set forth in part in the following description, or may be obvious from the description, or may be learned through practice of the invention.

Methods are generally provided for forming a conductive oxide layer on a substrate. In one particular embodiment, the method can include sputtering a transparent conductive oxide layer on a substrate at a sputtering temperature from about 10° C. to about 100° C. A cap layer including cadmium sulfide can be deposited directly on the transparent conductive oxide layer. The transparent conductive oxide layer can be annealed at an anneal temperature from about 450° C. to about 650° C.

Methods are also generally provided for manufacturing a cadmium telluride based thin film photovoltaic device. For example, one particular embodiment of the method can include sputtering a transparent conductive oxide layer on a substrate at a sputtering temperature from about 10° C. to about 100° C. A cap layer including cadmium sulfide can be deposited directly on the transparent conductive oxide layer, wherein the cap layer comprises cadmium sulfide. The transparent conductive oxide layer can be annealed at an anneal temperature from about 450° C. to about 650° C. Finally, a resistive transparent buffer layer can be formed over the transparent conductive oxide layer; a cadmium sulfide layer can be formed on the resistive transparent layer; a cadmium telluride layer can be formed on the cadmium sulfide layer; and, a back contact layer can be formed on the cadmium telluride layer.

An intermediate substrate is also provided for use to manufacture a thin film photovoltaic device. The substrate comprises a glass substrate, a transparent conductive oxide layer (e.g., comprising a cadmium tin oxide) on the glass substrate, and a removable cap layer directly on the transparent conductive oxide layer. The removable cap layer comprises cadmium sulfide and has a thickness of about 10 nm to about 150 nm.

These and other features, aspects and advantages of the present invention will become better understood with reference to the following description and appended claims. The accompanying drawings, which are incorporated in and constitute a part of this specification, illustrate embodiments of the invention and, together with the description, serve to explain the principles of the invention.

BRIEF DESCRIPTION OF THE DRAWING

A full and enabling disclosure of the present invention, including the best mode thereof, directed to one of ordinary skill in the art, is set forth in the specification, which makes reference to the appended figures, in which.

Figure 1:
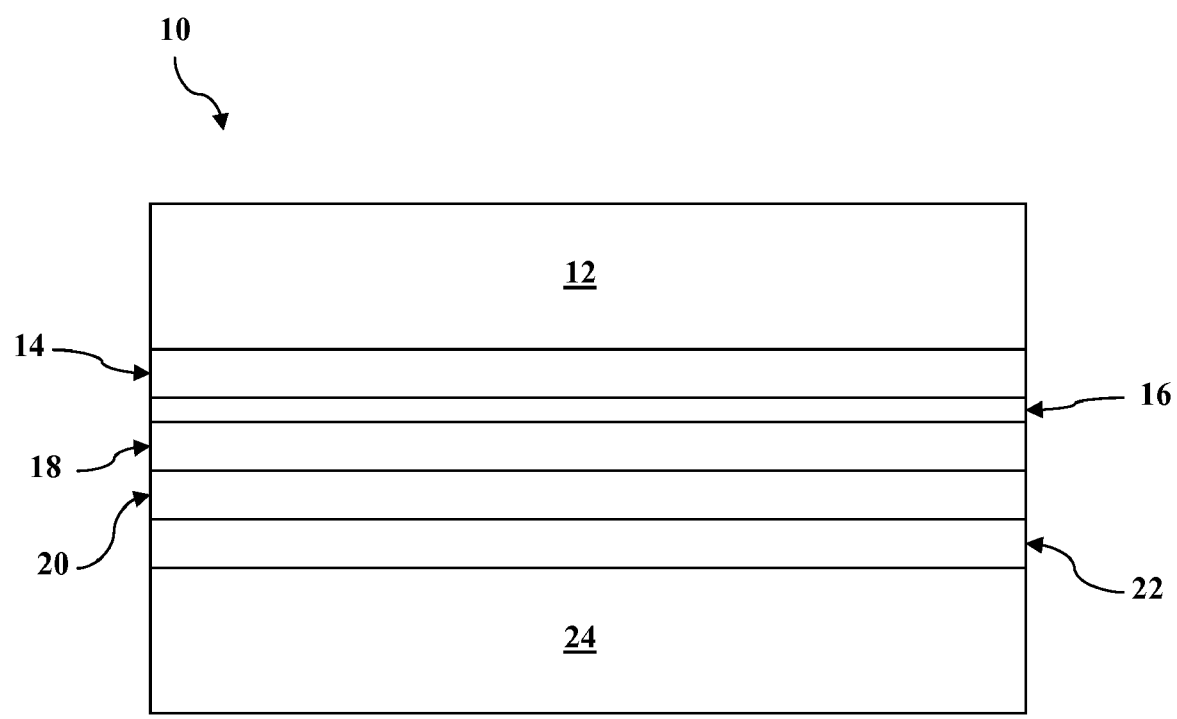
FIG. 1 shows a general schematic of a cross-sectional view of an exemplary cadmium telluride thin film photovoltaic device according to one embodiment of the present invention.

Repeat use of reference characters in the present specification and drawings is intended to represent the same or analogous features or elements.

DETAILED DESCRIPTION OF THE INVENTION

Reference now will be made in detail to embodiments of the invention, one or more examples of which are illustrated in the drawings. Each example is provided by way of explanation of the invention, not limitation of the invention. In fact, it will be apparent to those skilled in the art that various modifications and variations can be made in the present invention without departing from the scope or spirit of the invention. For instance, features illustrated or described as part of one embodiment can be used with another embodiment to yield a still further embodiment. Thus, it is intended that the present invention covers such modifications and variations as come within the scope of the appended claims and their equivalents.

In the present disclosure, when a layer is being described as "on" or "over" another layer or substrate, it is to be understood that the layers can either be directly contacting each other or have another layer or feature between the layers. Thus, these terms are simply describing the relative position of the layers to each other and do not necessarily mean "on top of" since the relative position above or below depends upon the orientation of the device to the viewer. Additionally, although the invention is not limited to any particular film thickness, the term "thin" describing any film layers of the photovoltaic device generally refers to the film layer having a thickness less than about 10 micrometers ("microns" or "µm").

It is to be understood that the ranges and limits mentioned herein include all ranges located within the prescribed limits (i.e., subranges). For instance, a range from about 100 to about 200 also includes ranges from 110 to 150, 170 to 190, 153 to 162, and 145.3 to 149.6. Further, a limit of up to about 7 also includes a limit of up to about 5, up to 3, and up to about 4.5, as well as ranges within the limit, such as from about 1 to about 5, and from about 3.2 to about 6.5.

Figure 3:
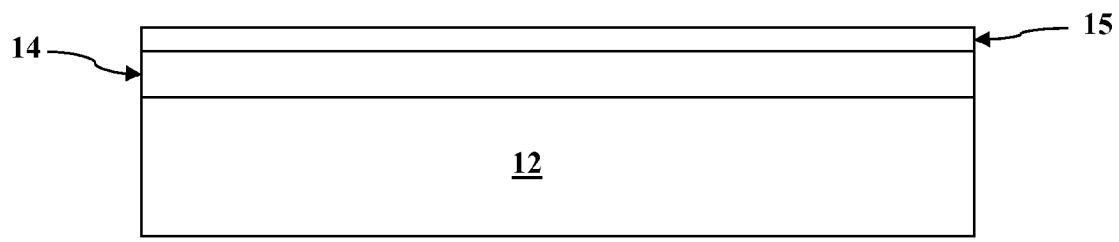
FIG. 3 shows an exemplary cap layer directly on a transparent conductive oxide layer.

Methods are generally disclosed for applying a cap layer of cadmium sulfide directly over a sputtered transparent conductive oxide layer ("TCO layer") on a substrate. An intermediate substrate is also disclosed for use to manufacture a thin film photovoltaic device. The intermediate substrate can include a glass substrate, a transparent conductive oxide layer on the glass substrate, and a removable cap layer directly on the transparent conductive oxide layer. The cap layer can prevent elements from subliming off of the TCO layer, especially cadmium from a cadmium-containing TCO layer. The cap layer can also add elements to the TCO layer, and in particular cadmium to a cadmium-containing TCO layer. Additionally, the cap layer can act as a reducing environment for the TCO layer, since the sulfur (S) can helps remove oxygen from the TCO layer, which would improve conductivity of the TCO layer. The cap layer can also add structural support to the TCO layer to inhibit cracking and/or delaminating of the TCO layer during any subsequent anneal process(es). Thus, the cap layer can serve to enhance the TCO layer formed in the PV device and/or protect the TCO layer during an anneal process after sputtering of the TCO layer until additional film layers can be deposited over the TCO layer in the production of a PV device (e.g., a cadmium telluride based thin film PV device). FIG. 3 shows an exemplary cap layer 15 directly on a TCO layer 14 over a substrate 12.

The TCO layer generally includes at least one conductive oxide, such as tin oxide, zinc oxide, or indium tin oxide, or mixtures thereof. Additionally, the TCO layer can include other conductive, transparent materials. The TCO layer can also include zinc stannate and/or cadmium stannate. The TCO layer can be formed by sputtering, chemical vapor deposition, spray pyrolysis, or any other suitable deposition method. In one particular embodiment, the TCO layer can be formed by sputtering (e.g., DC sputtering or RF sputtering) on the substrate from a target (e.g., a target including cadmium stannate and/or zinc stannate). For example, a cadmium stannate layer can be formed by sputtering a hot-pressed target containing cadmium stannate ($Cd_2SnO_4$) and/or stoichiometric amounts of $SnO_2$ and $CdO$ onto the substrate in a ratio of about 1 to about 2. A TCO layer can alternatively be prepared by using cadmium acetate and tin (II) chloride precursors by spray pyrolysis.

The cap layer is particularly useful when the TCO layer is deposited on the substrate via "cold sputtering" methods (e.g., sputtering temperatures of less than about 100° C.) that require a subsequent annealing step after deposition. For example, the sputtering temperatures for cold sputtering methods can be from about 10° C. to about 100° C., such as from about 15° C. to about 50° C. In one particular embodiment, the sputtering temperature for cold sputtering methods can be about room temperature (e.g., about 20° C. to about 25° C.). Sputtering deposition involves ejecting material from a target, which is the material source, and depositing the ejected material onto the substrate to form the film.

DC sputtering generally involves applying a direct current to a metal target (i.e., the cathode) positioned near the substrate (i.e., the anode) within a sputtering chamber to form a direct-current discharge. The sputtering chamber can have a reactive atmosphere (e.g., an oxygen atmosphere, nitrogen atmosphere, fluorine atmosphere) that forms a plasma field between the metal target and the substrate. The pressure of the reactive atmosphere can be between about 1 mTorr and about 20 mTorr for magnetron sputtering. The pressure can be even higher for diode sputtering (e.g., from about 25 mTorr to about 100 mTorr). When metal atoms are released from the target upon application of the voltage, the metal atoms deposit onto the surface of the substrate. For example, when the atmosphere contains oxygen, the metal atoms released from the metal target can form a metallic oxide layer on the substrate. The current applied to the source material can vary depending on the size of the source material, size of the sputtering chamber, amount of surface area of substrate, and other variables. In some embodiments, the current applied can be from about 2 amps to about 20 amps.

Conversely, RF sputtering involves exciting a capacitive discharge by applying an alternating-current (AC) or radio-frequency (RF) signal between the target (e.g., a ceramic source material) and the substrate. The sputtering chamber can have an inert atmosphere (e.g., an argon atmosphere) which may or may not contain reactive species (e.g., oxygen, nitrogen, etc.) having a pressure between about 1 mTorr and about 20 mTorr for magnetron sputtering. Again, the pressure can be even higher for diode sputtering (e.g., from about 25 mTorr to about 100 mTorr).

The annealing process generally involves heating the TCO layer to an anneal temperature (e.g., about 450° C. to about 650° C., such as from about 575° C. to about 630° C.). In certain embodiments, the substrate may be annealed at the anneal temperature from about 1 minute to about 30 minutes, such as from about 5 minutes to about 20 minutes. Annealing the TCO layer is believed to physically change the nature of the TCO layer from its as-deposited configuration (e.g., amorphous) to a more crystalline layer.

According to one particular embodiment, the presently disclosed cold sputtering methods generally involve three steps: (1) sputtering the TCO layer on the substrate from a target; (2) depositing a cap layer of cadmium sulfide directly onto the TCO layer; and, (3) annealing the deposited TCO layer at the anneal temperature.

For example, the TCO layer can be formed via cold sputtering from a cadmium stannate target to form a cadmium stannate TCO layer on the substrate. The cadmium stannate target may include other materials (e.g., zinc stannate, etc.). Without wishing to be bound by any particular theory, it is presently believed that cold sputtering from a cadmium stannate target can form a cadmium starmate TCO layer having the stoichiometry of $Cd_2SnO_4$. The cap layer can then be sputtered directly onto the TCO layer from a cadmium sulfide target. In this particular embodiment, the cap layer can inhibit the sublimation of cadmium from the cadmium stannate TCO layer during the subsequent anneal process.

The anneal process can be conducted with a cover shield removably attached to the cap layer (i.e., shielded) or without a cover shield (i.e. open-face). When annealed without a cover shield, the cap layer or a portion of the cap layer may sublimate off the TCO layer. The annealing temperature and duration can be tailored, along with the thickness of the cap layer, to remove a desired portion of the cap layer from the TCO layer while simultaneously annealing the TCO layer.

In one particular embodiment, the cap layer can be monitored during the anneal process to measure the amount of loss of the cap layer while annealing. For example, an optical transmission measurement can be used to determine the presence and/or thickness of the cadmium sulfide cap layer while annealing the TCO layer. Thus, the anneal process can be controlled such that the TCO layer is subjected to the annealing temperature only while protected by the cap layer. For instance, once the cap layer sublimates to a predetermined thickness (or sublimates completely from the TCO layer), then the anneal process can be stopped. In one embodiment, less than 25% of the cap layer can remain on the TCO layer after annealing, such as from about 1% to about 10%.

Figure 4:
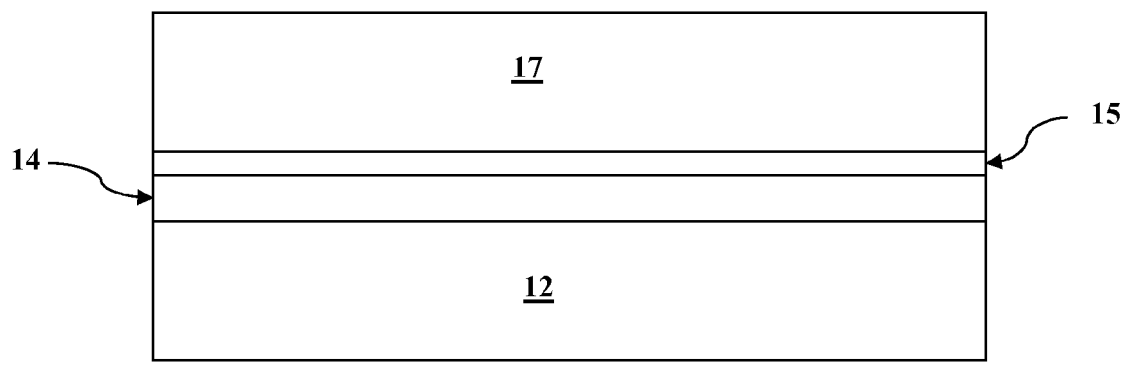
FIG. 4 shows an exemplary cover shield removably placed over the cap layer for annealing the TCO layer; and, FIG. 5 shows a flow diagram of an exemplary method of manufacturing a transparent conductive oxide layer.

When shielded, the cover shield can provide additional protection to the TCO layer by further inhibiting sublimation of cadmium from the TCO layer. Additionally, the cover shield can help to more uniformly heat the substrate helping to inhibit cracking and/or delamination of the TCO layer. FIG. 4 shows a cover shield 17 removably placed over the cap layer 15 for annealing.

Following the anneal process, whether shielded or open-faced, any remaining cap layer 15 can be removed from the TCO layer 14 to expose the surface of the TCO layer 14 for additional processing. In one particular embodiment, the cap layer can be cooled and then chemically etched to remove the remaining cap layer. The etchant can be chosen to provide selective removal of the cap layer of cadmium sulfide without substantially affecting the TCO layer. Suitable selective etchants are those that can remove cadmium sulfide without substantially removing or otherwise affecting the underlying TCO layer (e.g., cadmium stannate). Particular selective etchants can include, but are not limited to, hydrochloric acid, nitric acid, or mixtures thereof.

Figure 5:
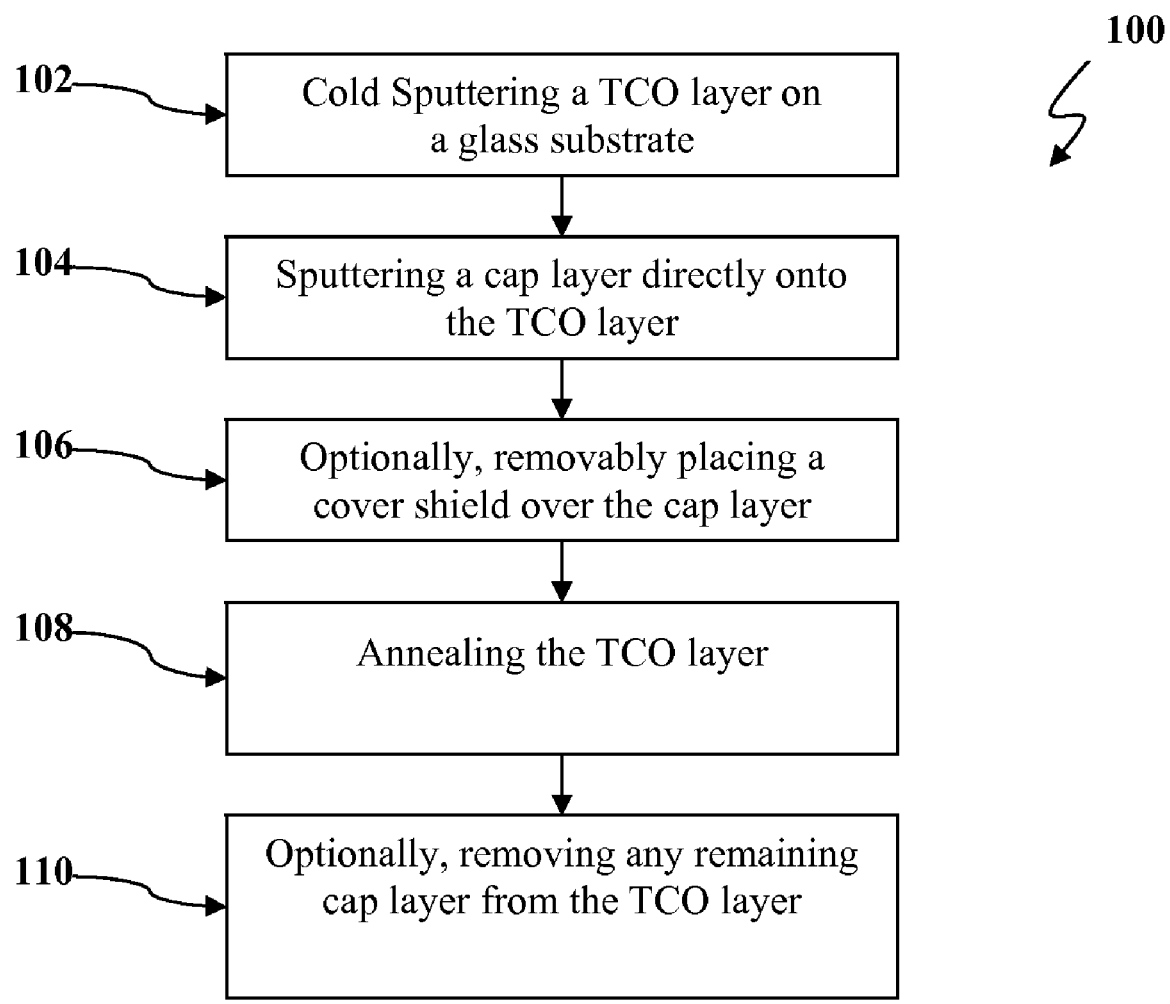

FIG. 5 shows a flow diagram of an exemplary method 100 of manufacturing a TCO layer according one embodiment of the presently disclosed method. At 102, a TCO layer is cold sputtered on a glass substrate. At 104, a cap layer is sputtered directly onto the TCO layer, and, optionally, a cover shield is removably placing over the cap layer at 106. The TCO layer is annealed at 108, and, optionally, any remaining cap layer is removed from the TCO layer.

The cap layer can be utilized in the formation of any film stack that utilizes a TCO layer, particularly those including a cadmium stannate TCO layer. For example, the cap layer can be used during the formation of any cadmium telluride device that utilizes a cadmium telluride layer, such as in the cadmium telluride thin film photovoltaic device disclosed in U.S. Publication No. 2009/0194165 of Murphy, et al. titled "Ultra-high Current Density Cadmium Telluride Photovoltaic Modules."

FIG. 1 represents an exemplary cadmium telluride thin film photovoltaic device 10 that can be formed according to methods described herein. The exemplary device 10 of FIG. 1 includes a top sheet of glass 12 employed as the substrate. In this embodiment, the glass 12 can be referred to as a "superstrate," as it is the substrate on which the subsequent layers are formed even though it faces upward to the radiation source (e.g., the sun) when the cadmium telluride thin film photovoltaic device 10 is in use. The top sheet of glass 12 can be a high-transmission glass (e.g., high transmission borosilicate glass), low-iron float glass, or other highly transparent glass material. The glass is generally thick enough to provide support for the subsequent film layers (e.g., from about 0.5 mm to about 10 mm thick), and is substantially flat to provide a good surface for forming the subsequent film layers. In one embodiment, the glass 12 can be a low iron float glass containing less than about 0.015% by weight iron (Fe), and may have a transmissiveness of about 0.9 or greater in the spectrum of interest (e.g., wavelengths from about 300 nm to about 900 nm). In another embodiment, borosilicate glass may be utilized so as to better withstand high temperature processing.

The transparent conductive oxide (TCO) layer 14 is shown on the glass 12 of the exemplary device 10 of FIG. 1. The TCO layer 14 allows light to pass through with minimal absorption while also allowing electric current produced by the device 10 to travel sideways to opaque metal conductors (not shown). For instance, the TCO layer 14 can have a sheet resistance less than about 30 ohm per square, such as from about 4 ohm per square to about 20 ohm per square (e.g., from about 8 ohm per square to about 15 ohm per square). In certain embodiments, the TCO layer 14 can have a thickness between about 0.1 μm and about 1 μm, for example from about 0.1 μm to about 0.5 μm, such as from about 0.25 μm to about 0.35 μm.

The TCO layer 14 can be formed with a cap layer 15, as shown in FIG. 3, and annealed as described above either without a cover shield (i.e., open-faced) or with a cover shield (e.g., glass) removably placed over the cap layer. FIG. 4 shows a cover shield 17 removably placed over the cap layer 15 for shielding the cap layer 15 during annealing. After annealing, the cap layer can then be substantially removed prior to depositing further layers over the TCO layer 14.

A resistive transparent buffer layer 16 (RTB layer) is shown on the TCO layer 14 on the exemplary cadmium telluride thin film photovoltaic device 10. The RTB layer 16 is generally more resistive than the TCO layer 14 and can help protect the device 10 from chemical interactions between the TCO layer 14 and the subsequent layers during processing of the device 10. For example, in certain embodiments, the RTB layer 16 can have a sheet resistance that is greater than about 1000 ohms per square, such as from about 10 kOhms per square to about 1000 MOhms per square. The RTB layer 16 can also have a wide optical bandgap (e.g., greater than about 2.5 eV, such as from about 2.7 eV to about 3.0 eV).

Without wishing to be bound by a particular theory, it is believed that the presence of the RTB layer 16 between the TCO layer 14 and the cadmium sulfide layer 18 can allow for a relatively thin cadmium sulfide layer 18 to be included in the device 10 by reducing the possibility of interface defects (i.e., "pinholes" in the cadmium sulfide layer 18) creating shunts between the TCO layer 14 and the cadmium telluride layer 22. Thus, it is believed that the RTB layer 16 allows for improved adhesion and/or interaction between the TCO layer 14 and the cadmium telluride layer 22, thereby allowing a relatively thin cadmium sulfide layer 18 to be formed thereon without significant adverse effects that would otherwise result from such a relatively thin cadmium sulfide layer 18 formed directly on the TCO layer 14.

The RTB layer 16 can include, for instance, a combination of zinc oxide (ZnO) and tin oxide ($SnO_2$), which can be referred to as a zinc tin oxide layer ("ZTO"). In one particular embodiment, the RTB layer 16 can include more tin oxide than zinc oxide. For example, the RTB layer 16 can have a composition with a stoichiometric ratio of $ZnO/SnO_2$ between about 0.25 and about 3, such as in about a one to two (1:2) stoichiometric ratio of tin oxide to zinc oxide. The RTB layer 16 can be formed by sputtering, chemical vapor deposition, spraying pryolysis, or any other suitable deposition method. In one particular embodiment, the RTB layer 16 can be formed by sputtering (e.g., DC sputtering or RF sputtering) on the TCO layer 14 (as discussed below in greater detail with respect to the deposition of the cadmium sulfide layer 18). For example, the RTB layer 16 can be deposited using a DC sputtering method by applying a DC current to a metallic source material (e.g., elemental zinc, elemental tin, or a mixture thereof) and sputtering the metallic source material onto the TCO layer 14 in the presence of an oxidizing atmosphere (e.g., $O_2$ gas). When the oxidizing atmosphere includes oxygen gas (i.e., $O_2$), the atmosphere can be greater than about 95% pure oxygen, such as greater than about 99%.

In certain embodiments, the RTB layer 16 can have a thickness between about 0.075 μm and about 1 μm, for example from about 0.1 μm to about 0.5 μm. In particular embodiments, the RTB layer 16 can have a thickness between about 0.08 μm and about 0.2 μm, for example from about 0.1 μm to about 0.15 μm.

A cadmium sulfide layer 18 is shown on RTB layer 16 of the exemplary device 10 of FIG. 1. The cadmium sulfide layer 18 is a n-type layer that generally includes cadmium sulfide (CdS) but may also include other materials, such as zinc sulfide, cadmium zinc sulfide, etc., and mixtures thereof as well as dopants and other impurities. In one particular embodiment, the cadmium sulfide layer may include oxygen up to about 25% by atomic percentage, for example from about 5% to about 20% by atomic percentage. The cadmium sulfide layer 18 can have a wide band gap (e.g., from about 2.25 eV to about 2.5 eV, such as about 2.4 eV) in order to allow most radiation energy (e.g., solar radiation) to pass. As such, the cadmium sulfide layer 18 is considered a transparent layer on the device 10.

The cadmium sulfide layer 18 can be formed by sputtering, chemical vapor deposition, chemical bath deposition, and other suitable deposition methods. In one particular embodiment, the cadmium sulfide layer 18 can be formed by sputtering (e.g., radio frequency (RF) sputtering) on the resistive transparent layer 16. Sputtering deposition generally involves ejecting material from a target, which is the material source, and depositing the ejected material onto the substrate to form the film. DC sputtering generally involves applying a voltage to a metal target (i.e., the cathode) positioned near the substrate (i.e., the anode) within a sputtering chamber to form a direct-current discharge. The sputtering chamber can have a reactive atmosphere (e.g., an oxygen atmosphere, nitrogen atmosphere, fluorine atmosphere) that forms a plasma field between the metal target and the substrate. The pressure of the reactive atmosphere can be between about 1 mTorr and about 20 mTorr for magnetron sputtering. When metal atoms are released from the target upon application of the voltage, the metal atoms can react with the plasma and deposit onto the surface of the substrate. For example, when the atmosphere contains oxygen, the metal atoms released from the metal target can form a metallic oxide layer on the substrate. Conversely, RF sputtering generally involves exciting a capacitive discharge by applying an alternating-current (AC) or radio-frequency (RF) signal between the target (e.g., a ceramic source material) and the substrate. The sputtering chamber can have an inert atmosphere (e.g., an argon atmosphere) having a pressure between about 1 mTorr and about 20 mTorr.

Due to the presence of the resistive transparent layer 16, the cadmium sulfide layer 18 can have a thickness that is less than about 0.1 μm, such as between about 10 nm and about 100 nm, such as from about 50 nm to about 80 nm, with a minimal presence of pinholes between the resistive transparent layer 16 and the cadmium sulfide layer 18. Additionally, a cadmium sulfide layer 18 having a thickness less than about 0.1 μm reduces any absorption of radiation energy by the cadmium sulfide layer 18, effectively increasing the amount of radiation energy reaching the underlying cadmium telluride layer 22.

A cadmium telluride layer 20 is shown on the cadmium sulfide layer 18 in the exemplary cadmium telluride thin film photovoltaic device 10 of FIG. 1. The cadmium telluride layer 20 is a p-type layer that generally includes cadmium telluride (CdTe) but may also include other materials. As the p-type layer of device 10, the cadmium telluride layer 20 is the photovoltaic layer that interacts with the cadmium sulfide layer 18 (i.e., the n-type layer) to produce current from the absorption of radiation energy by absorbing the majority of the radiation energy passing into the device 10 due to its high absorption coefficient and creating electron-hole pairs. For example, the cadmium telluride layer 20 can generally be formed from cadmium telluride and can have a bandgap tailored to absorb radiation energy (e.g., from about 1.4 eV to about 1.5 eV, such as about 1.45 eV) to create the maximum number of electron-hole pairs with the highest electrical potential (voltage) upon absorption of the radiation energy. Electrons may travel from the p-type side (i.e., the cadmium telluride layer 20) across the junction to the n-type side (i.e., the cadmium sulfide layer 18) and, conversely, holes may pass from the n-type side to the p-type side. Thus, the p-n junction formed between the cadmium sulfide layer 18 and the cadmium telluride layer 20 forms a diode in which the charge imbalance leads to the creation of an electric field spanning the p-n junction. Conventional current is allowed to flow in only one direction and separates the light induced electron-hole pairs.

The cadmium telluride layer 20 can be formed by any known process, such as vapor transport deposition, chemical vapor deposition (CVD), spray pyrolysis, electro-deposition, sputtering, close-space sublimation (CSS), etc. In one particular embodiment, the cadmium sulfide layer 18 is deposited by a sputtering and the cadmium telluride layer 20 is deposited by close-space sublimation. In particular embodiments, the cadmium telluride layer 20 can have a thickness between about 0.1 µm and about 10 µm, such as from about 1 µm and about 5 µm. In one particular embodiment, the cadmium telluride layer 20 can have a thickness between about 2 µm and about 4 µm, such as about 3 µm.

A series of post-forming treatments can be applied to the exposed surface of the cadmium telluride layer 20. These treatments can tailor the functionality of the cadmium telluride layer 20 and prepare its surface for subsequent adhesion to the back contact layer(s) 22. For example, the cadmium telluride layer 20 can be annealed at elevated temperatures (e.g., from about 350° C. to about 500° C., such as from about 375° C. to about 424° C.) for a sufficient time (e.g., from about 1 to about 10 minutes) to create a quality p-type layer of cadmium telluride. Without wishing to be bound by theory, it is believed that annealing the cadmium telluride layer 20 (and the device 10) converts the normally lightly p-type doped, or even n-type doped cadmium telluride layer 20 to a more strongly p-type cadmium telluride layer 20 having a relatively low resistivity. Additionally, the cadmium telluride layer 20 can recrystallize and undergo grain growth during annealing.

Annealing the cadmium telluride layer 20 can be carried out in the presence of cadmium chloride in order to dope the cadmium telluride layer 20 with chloride ions. For example, the cadmium telluride layer 20 can be washed with an aqueous solution containing cadmium chloride and then annealed at the elevated temperature.

In one particular embodiment, after annealing the cadmium telluride layer 20 in the presence of cadmium chloride, the surface can be washed to remove any cadmium oxide formed on the surface. This surface preparation can leave a Te-rich surface on the cadmium telluride layer 20 by removing oxides from the surface, such as CdO, $CdTeO_3$, $CdTe_2O_5$, etc. For instance, the surface can be washed with a suitable solvent (e.g., ethylenediamine also known as 1,2 diaminoethane or "DAE") to remove any cadmium oxide from the surface.

Additionally, copper can be added to the cadmium telluride layer 20. Along with a suitable etch, the addition of copper to the cadmium telluride layer 20 can form a surface of copper-telluride on the cadmium telluride layer 20 in order to obtain a low-resistance electrical contact between the cadmium telluride layer 20 (i.e., the p-type layer) and the back contact layer(s). Specifically, the addition of copper can create a surface layer of cuprous telluride ($Cu_2Te$) between the cadmium telluride layer 20 and the back contact layer 22. Thus, the Te-rich surface of the cadmium telluride layer 20 can enhance the collection of current created by the device through lower resistivity between the cadmium telluride layer 20 and the back contact layer 22.

Copper can be applied to the exposed surface of the cadmium telluride layer 20 by any process. For example, copper can be sprayed or washed on the surface of the cadmium telluride layer 20 in a solution with a suitable solvent (e.g., methanol, water, or the like, or combinations thereof) followed by annealing. In particular embodiments, the copper may be supplied in the solution in the form of copper chloride, copper iodide, or copper acetate. The annealing temperature is sufficient to allow diffusion of the copper ions into the cadmium telluride layer 20, such as from about 125° C. to about 300° C. (e.g. from about 150° C. to about 200° C.) for about 5 minutes to about 30 minutes, such as from about 10 to about 25 minutes.

A back contact layer 22 is shown on the cadmium telluride layer 20. The back contact layer 22 generally serves as the back electrical contact, in relation to the opposite, TCO layer 14 serving as the front electrical contact. The back contact layer 22 can be formed on, and in one embodiment is in direct contact with, the cadmium telluride layer 20. The back contact layer 22 is suitably made from one or more highly conductive materials, such as elemental nickel, chromium, copper, tin, aluminum, gold, silver, technetium or alloys or mixtures thereof. Additionally, the back contact layer 22 can be a single layer or can be a plurality of layers. In one particular embodiment, the back contact layer 22 can include graphite, such as a layer of carbon deposited on the p-layer followed by one or more layers of metal, such as the metals described above. The back contact layer 22, if made of or comprising one or more metals, is suitably applied by a technique such as sputtering or metal evaporation. If it is made from a graphite and polymer blend, or from a carbon paste, the blend or paste is applied to the semiconductor device by any suitable method for spreading the blend or paste, such as screen printing, spraying or by a "doctor" blade. After the application of the graphite blend or carbon paste, the device can be heated to convert the blend or paste into the conductive back contact layer. A carbon layer, if used, can be from about 0.1 µm to about 10 µm in thickness, for example from about 1 µm to about 5 µm. A metal layer of the back contact, if used for or as part of the back contact layer 22, can be from about 0.1 µm to about 1.5 µm in thickness.

The encapsulating glass 24 is also shown in the exemplary cadmium telluride thin film photovoltaic device 10 of FIG. 1.

Other components (not shown) can be included in the exemplary device 10, such as bus bars, external wiring, laser etches, etc. For example, when the device 10 forms a photovoltaic cell of a photovoltaic module, a plurality of photovoltaic cells can be connected in series in order to achieve a desired voltage, such as through an electrical wiring connection. Each end of the series connected cells can be attached to a suitable conductor such as a wire or bus bar, to direct the photovoltaically generated current to convenient locations for connection to a device or other system using the generated electric. A convenient means for achieving such series connections is to laser scribe the device to divide the device into a series of cells connected by interconnects. In one particular embodiment, for instance, a laser can be used to scribe the deposited layers of the semiconductor device to divide the device into a plurality of series connected cells.

Figure 2:
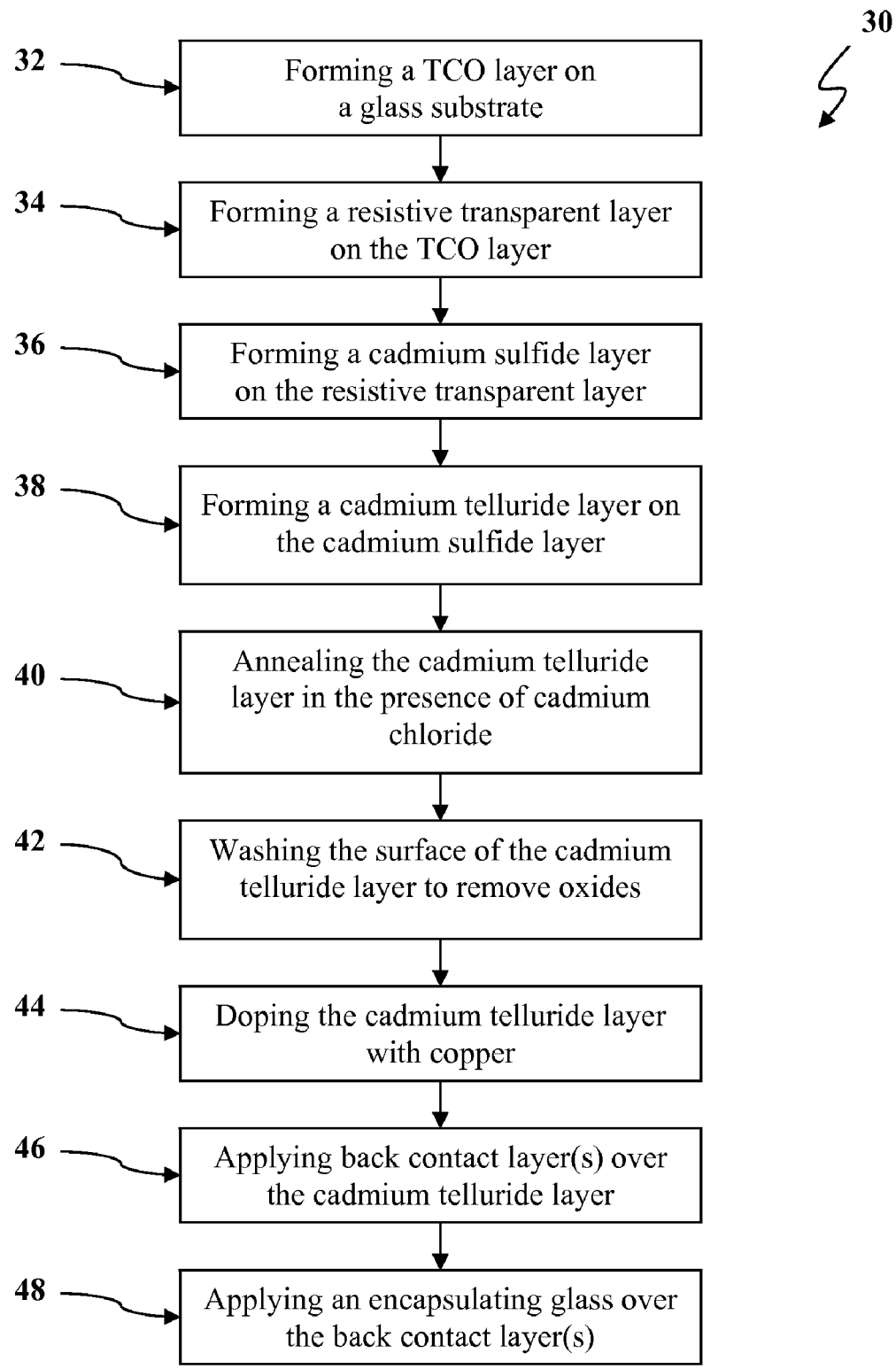
FIG. 2 shows a flow diagram of an exemplary method of manufacturing a photovoltaic module including a cadmium telluride thin film photovoltaic device.

FIG. 2 shows a flow diagram of an exemplary method 30 of manufacturing a photovoltaic device according to one embodiment of the present invention. According to the exemplary method 30, a TCO layer is formed on a glass substrate at 32. At 34, a resistive transparent layer is formed on the TCO layer. A cadmium sulfide layer is formed on the resistive transparent layer at 36, and a cadmium telluride layer is formed on the cadmium sulfide layer at 38. The cadmium telluride layer can be annealed in the presence of cadmium chloride at 40, and washed to remove oxides formed on the surface at 42. The cadmium telluride layer can be doped with copper at 44. At 46, back contact layer(s) can be applied over the cadmium telluride layer, and an encapsulating glass can be applied over the back contact layer at 48.

One of ordinary skill in the art should recognize that other processing and/or treatments can be included in the method 30. For instance, the method may also include laser scribing to form electrically isolated photovoltaic cells in the device. These electrically isolated photovoltaic cells can then be connected in series to form a photovoltaic module. Also, electrical wires can be connected to positive and negative terminals of the photovoltaic module to provide lead wires to harness electrical current produced by the photovoltaic module.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they include structural elements that do not differ from the literal language of the claims, or if they include equivalent structural elements with insubstantial differences from the literal languages of the claims.

What is claimed is:

1. A method for forming a conductive oxide layer on a substrate, the method comprising:
    sputtering a transparent conductive oxide layer on a substrate at a sputtering temperature from about 10° C. to about 100° C.;
    depositing a cap layer directly on the transparent conductive oxide layer, wherein the cap layer comprises cadmium sulfide; and,
    annealing the transparent conductive oxide layer at an anneal temperature of about 450° C. to about 650° C. to remove the cap layer, wherein less than 25% of the cap layer remains on the TCO layer after annealing.

2. The method as in claim 1, wherein the transparent conductive oxide layer comprises cadmium and tin.

3. The method as in claim 1, wherein the transparent conductive oxide layer is sputtered from a target comprising cadmium stannate.

4. The method as in claim 1, wherein the cap layer is sputtered onto the transparent conductive oxide layer from a target comprising cadmium sulfide.

5. The method as in claim 4, wherein the cap layer consists essentially of cadmium sulfide.

6. The method as in claim 4, wherein the cap layer is sputtered to a thickness of about 10 nm to about 150 nm.

7. The method as in claim 1, wherein the transparent conductive oxide layer is annealed in an annealing atmosphere comprising an inert gas.

8. The method as in claim 7, wherein the inert gas is argon.

9. The method as in claim 7, wherein the annealing atmosphere has a pressure of about 1 mTorr to about 100 mTorr.

10. The method as in claim 1, wherein the anneal temperature is of about 575° C. to about 625° C.

11. The method as in claim 1, wherein the transparent conductive oxide layer is annealed for about 1 minute to about 30 minutes.

12. The method as in claim 1, further comprising:
    monitoring sublimation of the cap layer while annealing the transparent conductive oxide layer.

13. The method as in claim 1, further comprising:
    cooling the substrate after annealing; and,
    chemically etching the cap layer.

14. The method as in claim 13, wherein the cap layer is chemically etched with an etchant comprising hydrochloric acid, nitric acid, or mixtures thereof.

15. The method as in claim 1, wherein the transparent conductive oxide layer is annealed open-faced.

16. The method as in claim 1, further comprising:
    removably positioning a cover shield over the cap layer prior to annealing such that the cap layer is shielded during annealing.

17. A method for manufacturing a cadmium telluride based thin film photovoltaic device, the method comprising:
    sputtering a transparent conductive oxide layer on a substrate at a sputtering temperature of about 10° C. to about 100° C.;
    depositing a cap layer directly on the transparent conductive oxide layer, wherein the cap layer comprises cadmium sulfide;
    annealing the transparent conductive oxide layer at an anneal temperature of about 450° C. to about 650° C.;
    thereafter forming a resistive transparent buffer layer over the transparent conductive oxide layer;
    forming a cadmium sulfide layer over the resistive transparent layer; and,
    forming a cadmium telluride layer over the cadmium sulfide layer.

18. The method as in claim 17, further comprising:
    cooling the substrate after annealing; and,
    chemically etching the cap layer prior to forming the resistive transparent layer over the transparent conductive oxide layer.

19. The method as in claim 17, wherein the cap layer is sputtered onto the transparent conductive oxide layer from a target comprising cadmium sulfide.

* * * * *